(12) United States Patent
Rose et al.

(10) Patent No.: US 10,503,680 B2
(45) Date of Patent: Dec. 10, 2019

(54) METHOD FOR OPERATING AN AUTOMATION DEVICE

(71) Applicant: WEIDMÜLLER INTERFACE GMBH & CO. KG, Detmold (DE)

(72) Inventors: Gorm Rose, Paderborn (DE); Marc Strünkmann, Paderborn (DE); Georg Kulturidi, Bielefeld (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

(21) Appl. No.: 15/690,539

(22) Filed: Aug. 30, 2017

(65) Prior Publication Data

US 2017/0364464 A1    Dec. 21, 2017

Related U.S. Application Data

(62) Division of application No. 14/965,482, filed on Dec. 10, 2015.

(30) Foreign Application Priority Data

Dec. 11, 2014   (DE) .................... 10 2014 118 389

(51) Int. Cl.
*G06F 13/40* (2006.01)
*G05B 19/05* (2006.01)
*G06F 13/16* (2006.01)

(52) U.S. Cl.
CPC ......... *G06F 13/409* (2013.01); *G05B 19/054* (2013.01); *G06F 13/16* (2013.01);
(Continued)

(58) Field of Classification Search
CPC .... G06F 13/409; G06F 13/16; G06F 13/4068; G05B 19/054; G05B 2219/15078; G05B 2219/31129
See application file for complete search history.

(56) References Cited

U.S. PATENT DOCUMENTS

2009/0244815 A1* 10/2009 Carolis ............... F15B 13/0857
361/614
2010/0180169 A1*  7/2010 La Fever ....... G01R 31/318536
714/727

(Continued)

FOREIGN PATENT DOCUMENTS

DE       102004056363 A1    6/2006
EP            2605092 A1    6/2013
EP            2899640 A1    7/2015

*Primary Examiner* — Idriss N Alrobaye
*Assistant Examiner* — Ronald T Modo
(74) *Attorney, Agent, or Firm* — Laubscher & Laubscher, P.C.

(57) ABSTRACT

An automation device has a main module and an interchangeable connection module in which a fieldbus port of the automation device is located. The automation device is characterized in that the interchangeable connection module contains a non-volatile memory which can be read out by the main module of the automation device. A method for operating the automation device includes the steps of connecting a main module of the automation device with a connection module, reading the non-volatile memory of the connection module, detecting any incompatibilities between the main module and the connection module, and placing the automation device in operation if no incompatibilities are detected.

5 Claims, 9 Drawing Sheets

(52) U.S. Cl.
CPC ............... *G06F 13/4068* (2013.01); *G05B 2219/15078* (2013.01); *G05B 2219/31129* (2013.01)

(56) References Cited

U.S. PATENT DOCUMENTS

| | | | |
|---|---|---|---|
| 2011/0119556 A1* | 5/2011 | de Buen | H04L 41/12 714/758 |
| 2012/0093242 A1* | 4/2012 | Wallace | G05B 19/042 375/259 |
| 2012/0185199 A1* | 7/2012 | Moran | G01R 19/2516 702/107 |
| 2013/0282931 A1* | 10/2013 | Petzen | H04L 61/2038 710/9 |
| 2015/0212962 A1 | 7/2015 | Orehawa | |

* cited by examiner

METHOD FOR OPERATING AN AUTOMATION DEVICE

This application is a division of application Ser. No. 14/965,482 filed Dec. 10, 2015.

BACKGROUND OF THE INVENTION

The invention relates to an automation device having a main module and an interchangeable connection module including a fieldbus port for the automation device. The invention further relates to an interchangeable connection module for an automation device of this type, and to a method for operating an automation device having an interchangeable connection module.

In industrial automation systems, at least one control computers, master computer, or programmable logic controller (PLC) and a plurality of field devices are provided. Fieldbuses are used to transmit control data and/or measured values between the computers or controllers and the field devices. The field devices include input and output modules, hereinafter abbreviated to I/O (input/output) modules, which provide analog and/or digital input and/or output channels through which system components can be controlled and through which measured values, for example from sensors, can be read or input. Frequently, rather than being connected directly to a fieldbus, each field device is connected to a fieldbus via a fieldbus coupler which acts as a data interface between the fieldbus on one side and an often proprietary sub-bus on the other. A plurality of bus-capable modules, for example the I/O modules, can be coupled to the sub-bus.

As described herein, an automation device is construed to be any component of an automation system that has a fieldbus port. Thus, automation devices include both control computers and fieldbus couplers or field devices that are connected directly to a fieldbus.

BRIEF DESCRIPTION OF THE PRIOR ART

A number of different fieldbus systems are in standard use in automation systems. These include, for example, Profibus, Profinet and EtherCAD. To avoid having to provide automation devices in a plurality of different configurations for the various fieldbus systems, automation devices that have interchangeable connection modules for the different fieldbus systems are known, as disclosed for example in German patent No. DE 10 2004 056 363 A1. The modular connection concept decreases the costs of developing, producing and storing the automation devices. For users of the automation devices, the modular system also facilitates changing the fieldbus system in an existing system or reusing automation devices in new systems, even when a fieldbus system is different from those previously used.

With a modular system of this type, however, there is a risk that an automation device might be operated using an unsuitable connection module. Certain pairings of an automation device and a connection module may not be allowable owing to hardware engineering, software engineering and/or licensing reasons.

The present invention was developed in order to overcome these and other drawbacks of the prior devices by providing an automation device and a connection module that is suitable for use in the automation device in which compatibility problems between the main module and the connection module are prevented, as well as a method for operating such an automation device.

SUMMARY OF THE INVENTION

An automation device according to the invention includes a connection module having a non-volatile memory that can be read out by the main module of the automation device.

Information regarding the compatibility of the various devices can be stored in the non-volatile memory of the connection module. In this manner, once the automation device has been coupled to the connection module, the automation device can query whether the connection module is suitable and permissible in terms of hardware, software or licensing factors for cooperating with the main module of the automation device. Furthermore, the non-volatile memory of the connection module may contain programs or program elements or program sections which can be read in by the automation device once it has been coupled to the connection module, and any preexisting software-related incompatibilities can be rectified.

In a preferred embodiment of the automation device, the non-volatile memory of the connection module is a flash memory, a ferroelectric memory (FRAM—Ferroelectric Random Access Memory) or an EEPROM (Electrically Erasable Programmable Read-Only Memory). The non-volatile memory is preferably permanently soldered to a circuit board of the connection module, with components of an interface driver and/or of a central control unit for operating the fieldbus port of the connection module being arranged on the circuit board. Integrating the non-volatile memory into the circuit board of the fieldbus port makes tampering with the connection module more difficult.

In a further preferred embodiment, the non-volatile memory is connected with a control unit or with an interface driver for the fieldbus port of the connection module. This allows the non-volatile memory to also be used for receiving information to be stored for the connection module, for example firmware for the connection module.

In a further embodiment of the automation device, the connection module has a plug connector for connecting with the main module of the automation device, the plug connector being coupled to the non-volatile memory in the connection module. The coupling between the plug connector and the non-volatile memory can then be established directly via an interface driver assigned to the non-volatile memory. In that case, the plug connector provides a separate data channel for transmitting the data from the non-volatile memory to the main module. A plug connector used solely for the data channel may be provided, or part of a plug connector that is also used for other purposes may be used for the data channel.

Alternatively, the non-volatile memory can be connected via an interface driver to a central control unit of the connection module and can be coupled via the control unit and optionally via an additional interface driver to the plug connector. In that case, only one data channel is established between the main module and the connection module through which the data from the non-volatile memory are transmitted to the main module and the fieldbus data are exchanged.

In a further embodiment of the automation device, the main module and/or the connection module have couplers for mechanically connecting the connection module to the main module. The couplers are preferably in the form of locking hooks.

According to another embodiment of the automation device, the main module and/or the connection module are designed to be mounted on a mounting rail and in particular contain a recess for snap-on connection with the mounting rail. In addition to the mechanical interconnection of the main module and the connection module, this allows the automation device to be mechanically secured in an equipment cabinet for example.

In other embodiments of the automation device, the device is a fieldbus coupler and/or a control computer.

The invention is also directed to a connection module for an automation device, the connection module containing a non-volatile memory which can be read out by a main module of the automation device via a plug connector located on the connection module.

The invention also encompasses a method for operating an automation device in which a main module of the automation device is connected to a connection module, and a non-volatile memory of the connection module is read out by the main module. Any incompatibilities that exist between the main module and the connection module are then detected. If no incompatibilities are detected, the automation device is placed in operation.

In one embodiment of the method, data from the non-volatile memory of the connection module are used in the main module to rectify any incompatibilities that may exist. In a further embodiment, data from the non-volatile memory of the connection module are used to update operational software, particularly firmware, in the main module.

According to another embodiment of the method, the connection module provides a wireless communication channel. The wireless communication channel can be used to link a laptop computer or tablet to the main module via the connection module for diagnostic or configuration purposes. The connection module thus further expands the main module as needed with this connection option. As a result, the modularity of the system and its capacity for upgrading are further increased. The wireless communication channel can be based on a WLAN (Wireless Local Area Network) standard, an NFC (Near Field Communication) standard, a Zigbee standard or a Bluetooth standard.

BRIEF DESCRIPTION OF THE FIGURES

Other objects and advantages of the invention will become apparent from a study of the following specification when viewed in the light of the accompanying drawing, in which:

FIG. 8 is a plan view of the automation device of FIG. 6a.

DETAILED DESCRIPTION

Figure 1A:
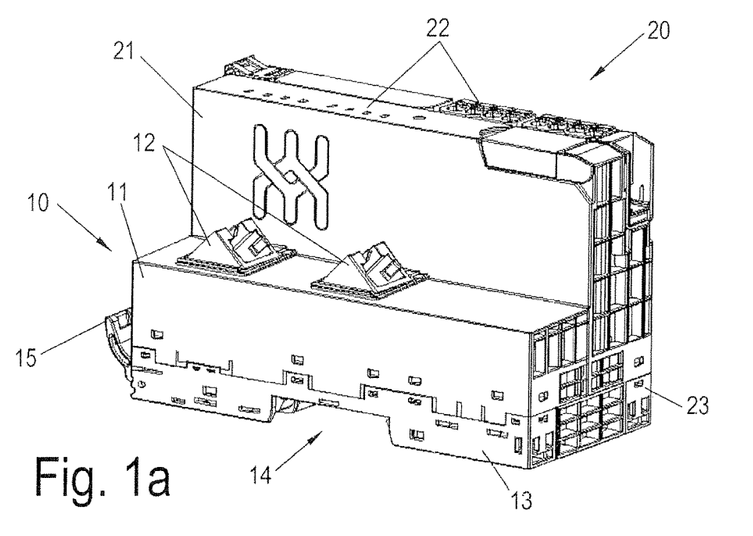
FIGS. 1a and 1b are perspective views of a first embodiment of an automation device according to the invention showing a main module and a connection module in attached and detached conditions, respectively.
Figure 1B:
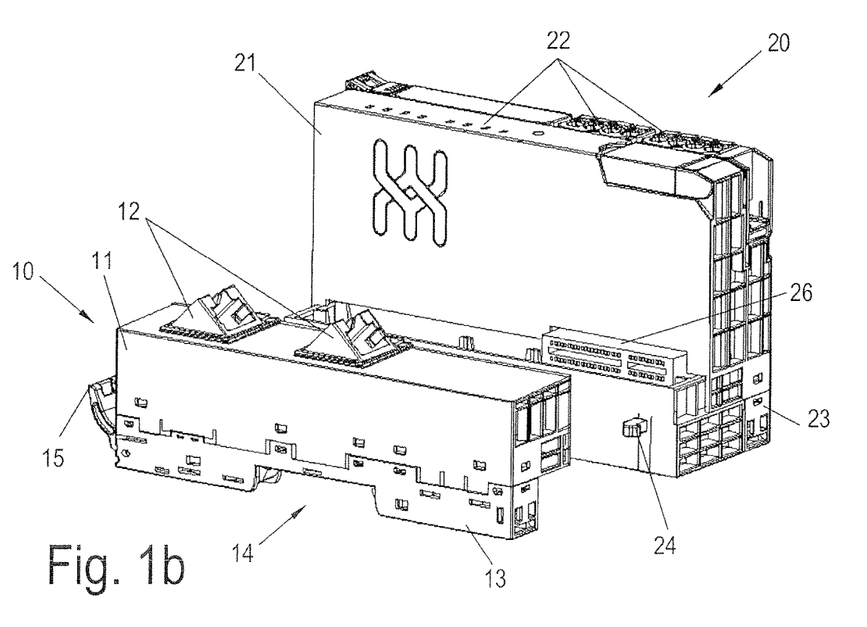
Figure 2:
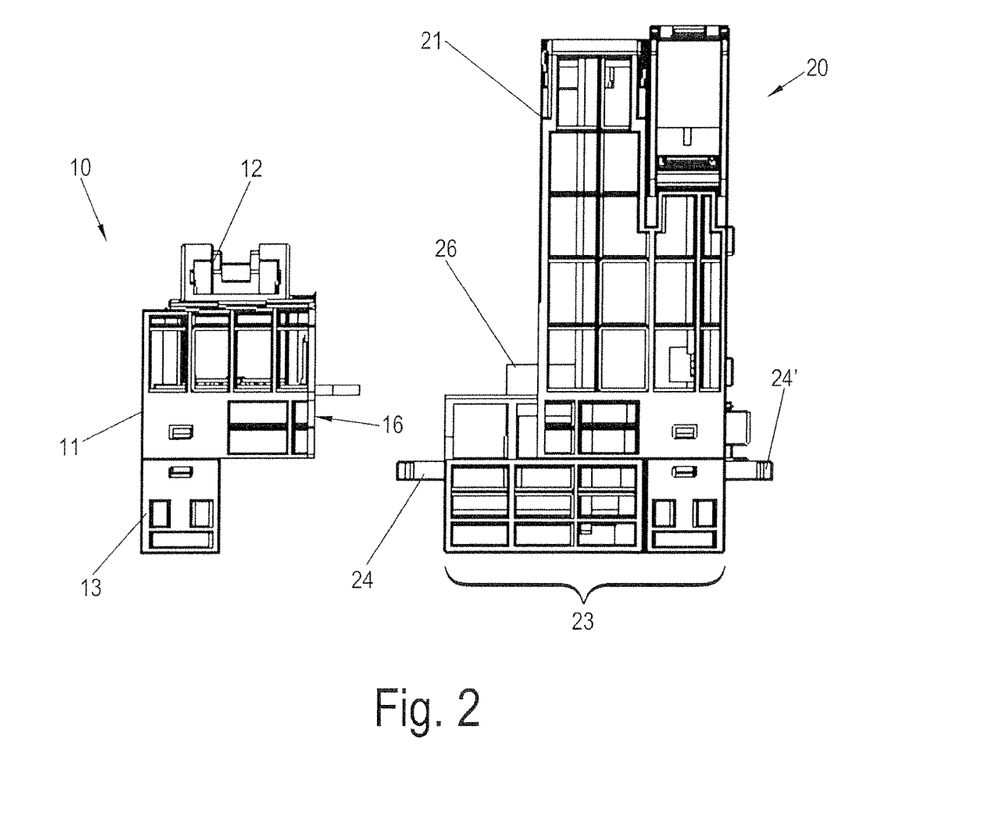
FIG. 2 is an exploded side view of the detached main module and connection module of the automation device shown in FIG. 1b.

FIGS. 1a, 1b and 2 illustrate a first embodiment of an automation device according to the invention, in perspective view (FIGS. 1a and 1b) and in a side view (FIG. 2). The automation device of this embodiment is a fieldbus coupler.

The fieldbus coupler includes a fieldbus coupler main module 20, hereinafter referred to as main module 20, and a connection module 10 attached thereto. FIG. 1a shows the fieldbus coupler in the assembled state, whereas FIGS. 1b and 2 show connection module 10 detached from the main module 20.

The main module 20 includes a housing upper section 21, the top surface of which includes a display and a connecting element 22. The housing upper section 21 is attached to a housing lower section 23 which in the embodiment shown is designed to be mounted on a mounting rail, in particular a snap-on mounting rail, not shown.

In this embodiment, connection module 10 includes a housing formed of multiple sections which in this case are an upper section 11 and a lower section 13. On a top surface of connection module 10, fieldbus ports 12 are provided. In the illustrated embodiment, two fieldbus ports 12 for receiving "RJ-45"-model plugs are shown. The connection module 10 is suitable for an EtherCAD fieldbus.

In the housing lower section 13 of the connection module 10, a mounting rail recess is provided, preferably a snap-on mounting rail recess 14. T snap-on mounting rail recess 14 has a laterally acting locking slide for locking onto a snap-on mounting rail. To release the connection to the snap-on mounting rail, a lateral unlocking lever 15 is provided.

As shown in FIG. 1a, connection module 10 can be placed flush onto main module 20, where it is mechanically coupled and preferably locked thereto. For this purpose, a coupler 24 is provided on the main module 20. In this case, the coupler is in the form of a locking hook or hooks, which are shown in FIGS. 1b and 2. Couplers 24 engage in correspondingly undercut locking elements of connection module 10.

To establish an electrical connection between connection module 10 and main module 20, a plug connector 16 is located on the connection module 10 and a complementary mating connector 26 is located on the main module 20. When the main module 20 and the connection module 10 are coupled with one another, signals for actuating fieldbus ports 12 are transmitted between the two modules via the plug connector 16 and the mating connector 26. Furthermore, a non-volatile memory integrated within the connection module 10 is connected via plug connector 16 and mating connector 26 to control devices of the main module 20 such that the main module 20 is able to access the contents of the non-volatile memory in connection module 10. This will be described in greater detail below in connection with the schematic block diagram of FIG. 5.

Figure 3A:
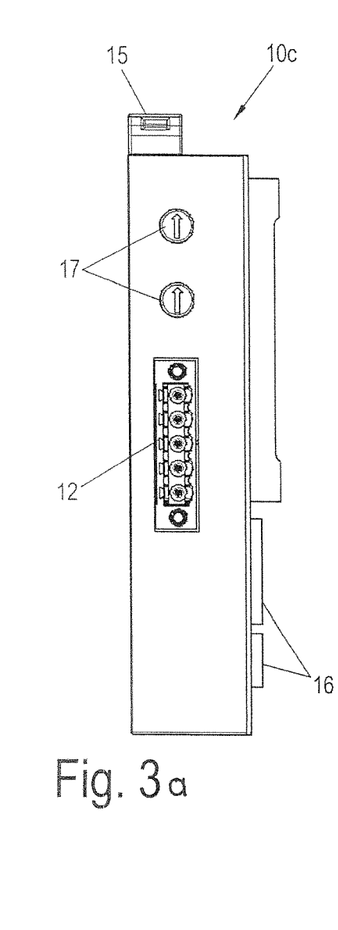
FIGS. 3a-c are plan views of three types of connection modules of an automation device.
Figure 3B:
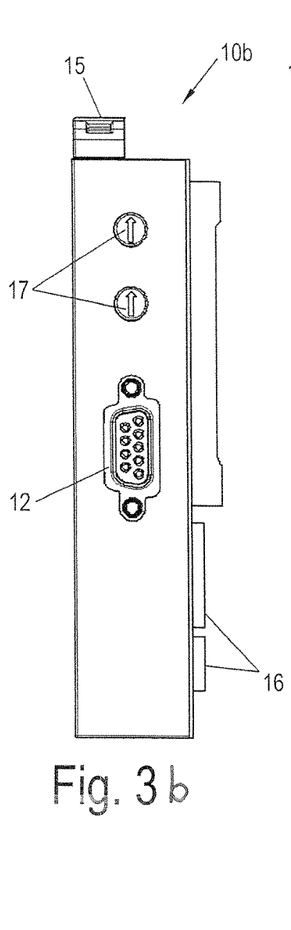
Figure 3C:
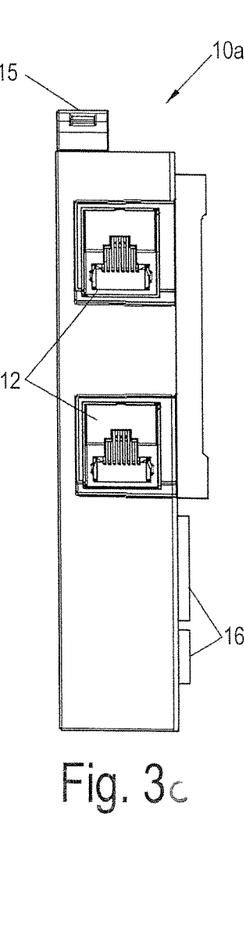
Figure 3D:
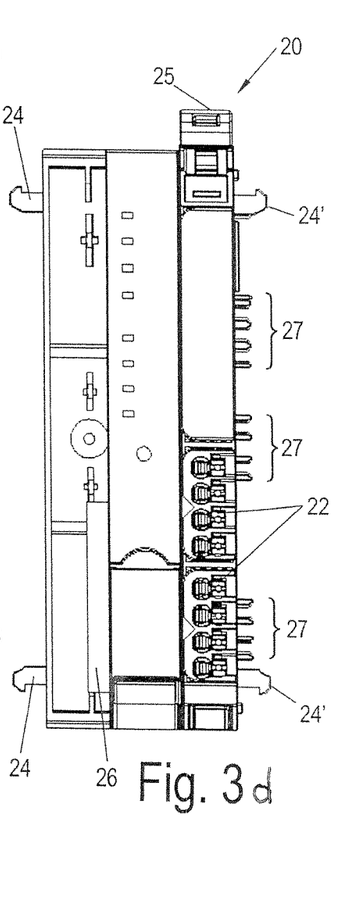
FIG. 3d is a plan view of a main module for the connection modules of FIGS. 3a-c.

FIG. 3d shows the main module 20 and FIGS. 3a-3c show the connection modules 10c, 10b, and 10a, respectively, of FIGS. 1 and 2, in a plan view in which they are detached from one another.

References 10b and 10c identify two additional embodiments of a connection module 10 for use with main module 20 of the fieldbus coupler as shown in FIGS. 3b and 3a, respectively. These are distinguished from the connection module 10a by the use of a fieldbus port 12 of a different fieldbus system. Connection module 10b is suitable for a Profibus fieldbus. Connection modules 10b and 10c are further distinguished from connection module 10a in that adjustment elements 17 are provided which can be used for address coding for fieldbus port 12. Of course, the adjustment elements 17 need not be located on the top surface of the connection modules 10b, 10c. They may instead be located on a lateral surface. For adjustment elements in which inadvertent displacement is to be avoided wherever possible, arranging the elements on the side that faces the main module 20 is advantageous. It should be noted that, in addition to the adjustment elements 17 shown, display elements such as light-emitting diodes may be provided on the connection module 10.

In the plan view of FIG. 3d, an unlocking lever 25 is also visible on the main module 20 and is used to release the snap-on mounting rail recess, not shown, provided on the main module 20. On the side opposite the connection module 10, the main module 20 has additional couplers 24', which are identical in design to couplers 24. These additional couplers 24' are used for mechanical coupling to bus-capable modules, for example IO modules, which are connected with the fieldbus coupler main module 20.

For the electrical connection of modules of this type, bus contacts 27 are formed on the main module 20 which are used for current distribution, for the supply of power and for the exchange of data between the bus-capable modules and fieldbus coupler 20. A similar mechanical configuration of the couplers between the bus-capable modules and the main module 20 of the fieldbus coupler and between the main module 20 and the connection module 10 enables housing components to be reused. For example, housing lower section 13 of the connection module 10 is substantially identical to at least part of the housing lower section 23 of the main module 20. Housing lower section 13 of connection module 10 can also be used with the bus-capable modules.

Figure 4A:
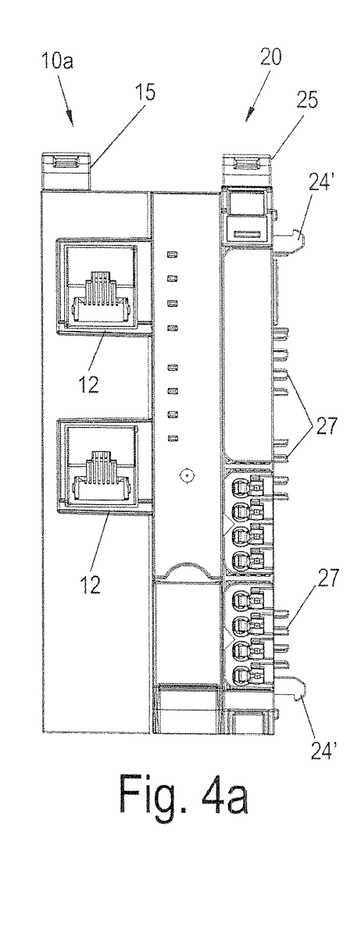
FIGS. 4a-c are plan views of different combinations of main and connection module according to the invention.
Figure 4B:
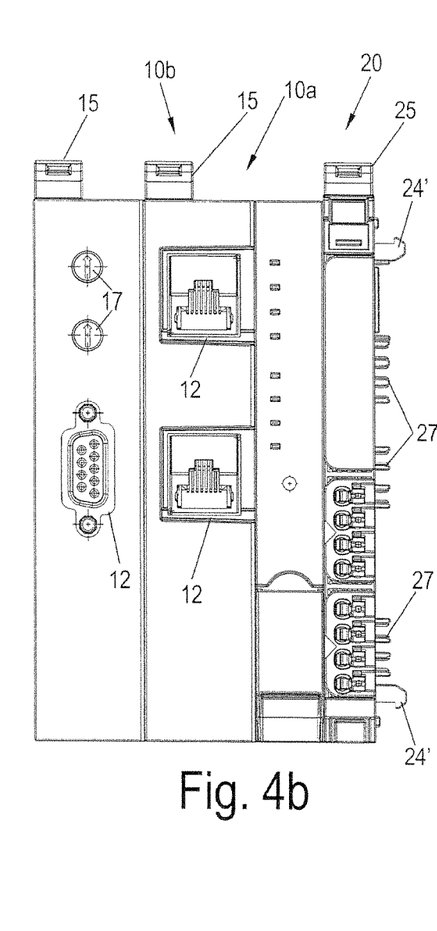
Figure 4C:
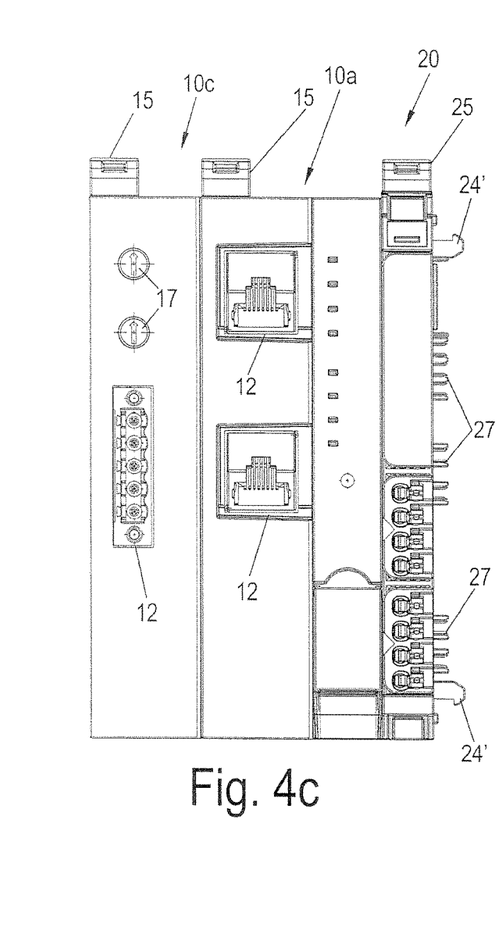

FIG. 4a shows a plan view of the fieldbus coupler including a main module 20 and a connection module 10a. FIGS. 4b and 4c show configurations of the fieldbus coupler in which a plurality of connection modules 10 are used simultaneously.

For instance, FIG. 4b shows a plan view similar to that of FIG. 4a in which a connection module 10b is connected as an additional connection module to the combination of the main module 20 and connection module 10a. For this purpose, connection module 10a in this embodiment is configured such that it also has couplers, which are similar to couplers 24 of main module 20 and which can be used to establish the mechanical connection to the connection module 10b. Furthermore, on the side of the connection module 10a that faces connection module 10b, mating connectors similar to mating connectors 26 of the coupling module 20 are provided which can be used to establish an electrical connection between the two connection modules 10a and 10b.

Data exchanged between the main module 20 and the connection module 10b are forwarded by the connection module 10a via the combination of a mating connector 26 and a plug connector 16 or via the combination of the mating connector and the plug connector 16 of the connection module 10b. In this manner, data can be exchanged both between main module 20 and the connection module 10a and between main module 20 and the connection module 10b.

In the same manner as in FIG. 4b, FIG. 4c shows a configuration in which the main module 20 of the fieldbus coupler is connected to a first connection module 10a, to which a second connection module 10c is connected.

Figure 5:
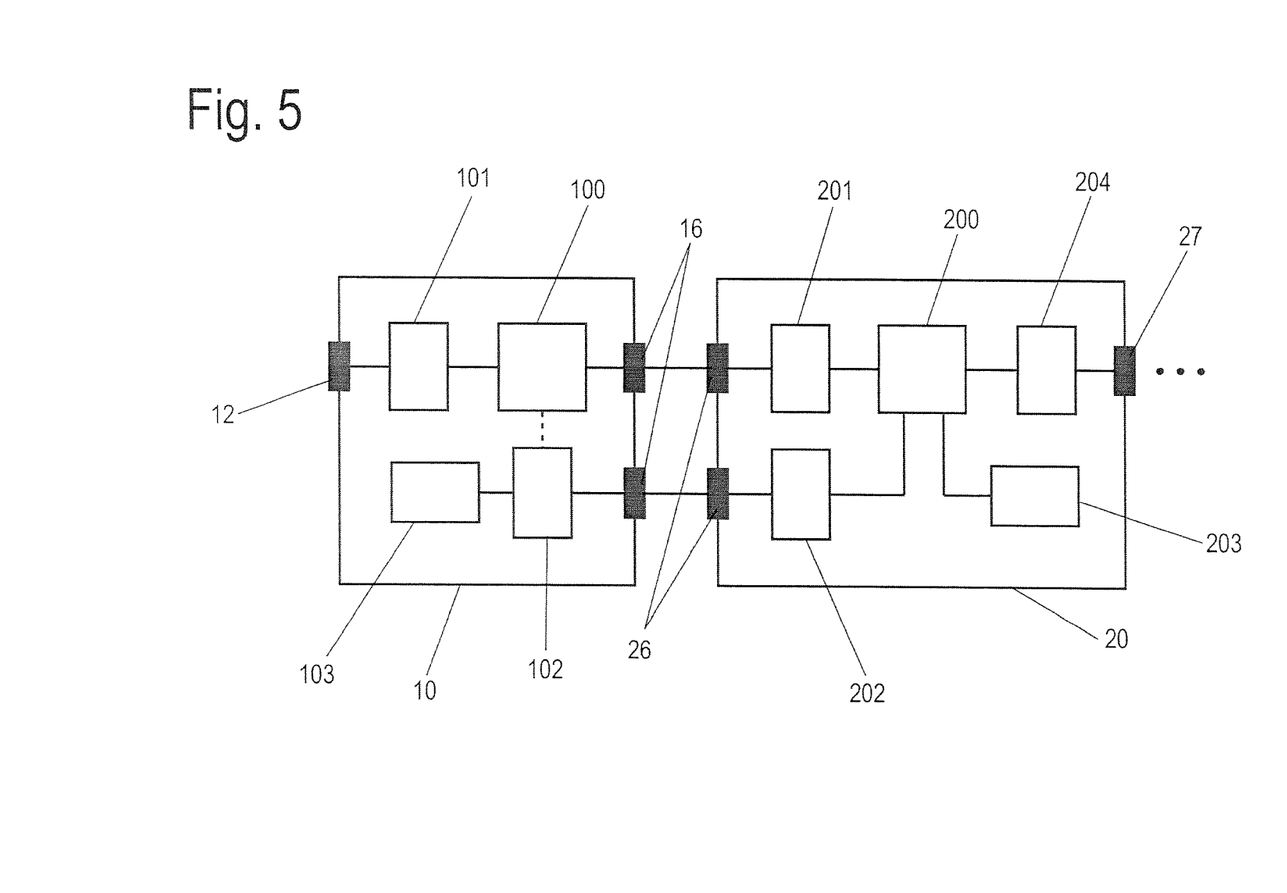
FIG. 5 is a block diagram of an automation device.

FIG. 5 is a block diagram showing the combination of a main module 20 and a connection module 10 of an automation device configured for an intended use. This may be the main module 20 and one of connection modules 10 or 10a to 10c, according to FIGS. 1 to 4 for example.

The main module 20 includes a central control unit 200 such as a microcontroller. The microcontroller is connected with interface drivers 201, 202 and 204 through which the control unit 200 is connected to various ports. Interface drivers 201 and 202 contact mating connectors 26 through which the electrical connection to the connection module 10 is established. Interface driver 204 couples control unit 200 to bus port 27, to which the bus-capable modules (IO modules) are connected. The control unit 200 is also connected with a memory 203. This memory can have volatile and/or non-volatile memory areas. An interface driver that may be required for controlling memory 203 is not shown.

In the embodiment shown, the connection module 10 likewise includes a central control unit 100 such as a microcontroller. Connected to control unit 100 is a fieldbus interface driver 101 to which a fieldbus port 12 is coupled. Information is exchanged between the connection module 10 and the main module 20 between interface drivers 101 and 201, such as with the interconnection of control unit 100. A proprietary protocol may be used for this purpose, which does not correspond to the protocol of fieldbus port 12. It also is not required that the hardware for the transmission of data via plug connector 16 and/or mating connector 26 correspond to that of fieldbus port 12. The protocol will be converted in control unit 100 or in fieldbus interface driver 101. However, it is also possible for the transmission of information between interface drivers 101 and 201 to be based on the same protocol and/or the same hardware specifications that are used for the fieldbus port 12.

According to the invention, the connection module 10 includes a non-volatile memory 103, for example a flash memory, a ferroelectric memory (FRAM—Ferroelectric Random Access Memory) or an EEPROM (Electrically Erasable Programmable Read-Only Memory). The information in the memory is read out by the control unit 200 of the main module 20 via an interface driver 201 and the combination of the plug connector 16 and the mating connector 26, and via an interface driver 202. In the embodiment shown, the data transmission path used for this information is separate from the transmission path used for the data that are output at fieldbus port 12. Accordingly, signal lines for the plug connector 16 and/or the mating connector 26 can be provided separately for the different data paths. In the embodiment of FIG. 3, this is also indicated by a spatial separation of the different regions of plug connector 16. However, in the embodiment shown, a common plug housing is used. In alternative embodiments, when a common plug housing is used, spatial separation of the different regions of the plug is not required, particularly if the signal levels present in the different regions are of a comparable magnitude.

In a method according to the invention, the automation device uses the main module to access the non-volatile memory located in the connection module. One embodiment of a method of this type will be described in greater detail below with reference to the fieldbus coupler shown schematically in FIG. 5.

For example, once the main module 20 is started, the control unit 200 accesses the interface driver 202 to query whether a connection module 10 is connected with the plug connector 26. If a connection module 10 is connected, the interface driver 202 establishes a communication link, via the mating connector 26 and the plug connector 16, to interface driver 102 for non-volatile memory 103. The link between the two interface drivers 102 and 202 can be based on a known protocol, for example according to the USB (Universal Serial Bus) specification. Once the presence of a connection module 10 has been detected and a communication link between interface drivers 102 and 202 has been established, microcontroller 200 accesses the content of non-volatile memory 103. It should be noted that, in further embodiments of the connection module 10, the non-volatile memory 103 can be coupled to the plug connector 16 directly, that is, without the interface driver 102. The non-volatile memory 103 is then addressed directly by main module 20.

On the basis of compatibility data that are stored in the non-volatile memory 103, control unit 200 then determines whether the connected connection module 10 is compatible with the main module 20. The non-volatile memory 103 may also contain license data, which can be used to determine whether main module 20 is licensed for use with the fieldbus that can be connected to fieldbus port 12 of connection module 10.

The non-volatile memory 103 may also contain program segments or programs, which can be input by the control unit 200 and can be used to update control programs, for example the firmware of the control unit 200 of the main module 20. Firmware of this type is stored in the memory 203 of the main module 20 and is updated appropriately using the information from the non-volatile memory 103. As a result, a newer connection module 10 for a newer or updated fieldbus variant can also be connected to an older main module 20, the software of which is not configured for use with a certain fieldbus type. Once the connection module 10 has been connected, the software of the main module 20 is updated automatically, so that the main module is configured for use with the connection module 10.

To prevent any tampering with the connection module 10, the non-volatile memory 103 can be permanently soldered to a circuit board of the connection module 10. Furthermore, relevant information, for example regarding compatibilities and/or license data, can be stored in the non-volatile memory 103 in encrypted form. Decryption is preferably carried out by the control unit 200 once the content of the memory 103 has been read out using key data stored in main module 20, for example in the memory 203.

Figure 6A:
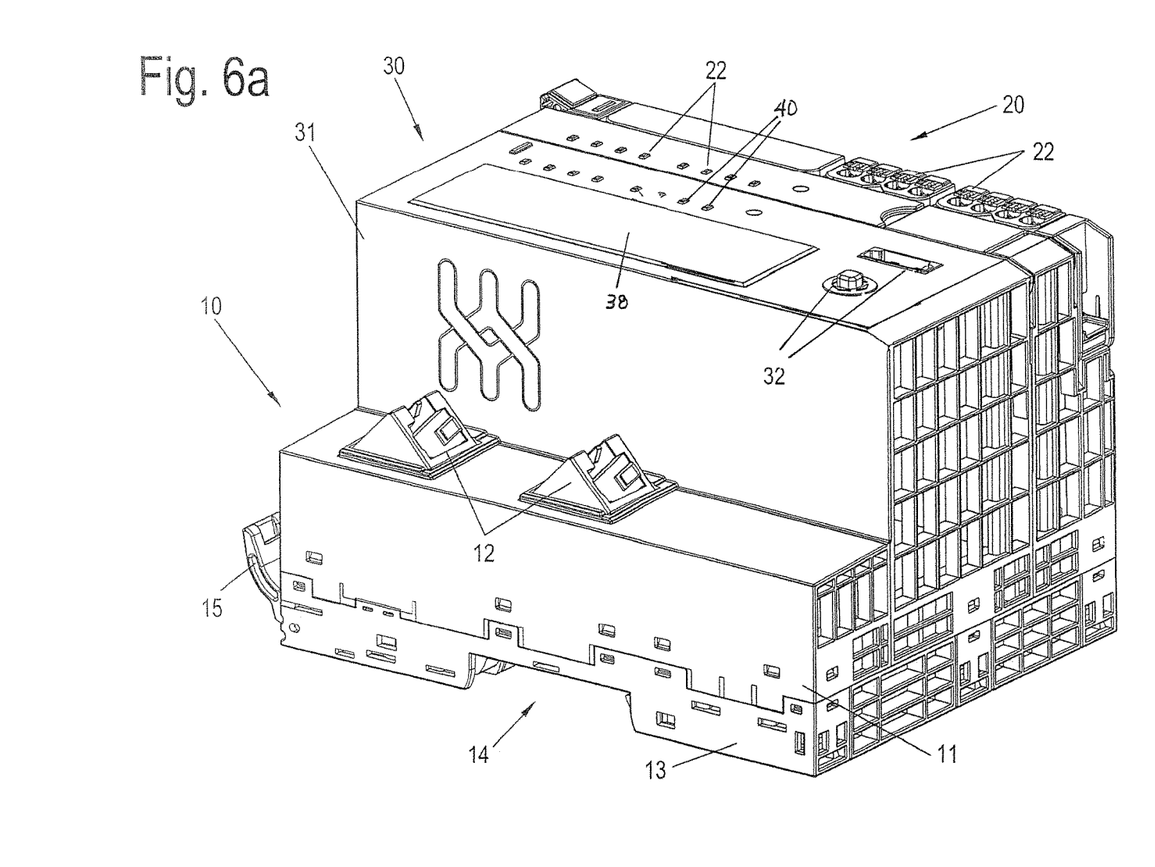
FIGS. 6a and 6b are perspective views of an alternate embodiment of an automation device according to the invention showing two main modules and a connection module in attached and detached conditions, respectively.
Figure 6B:
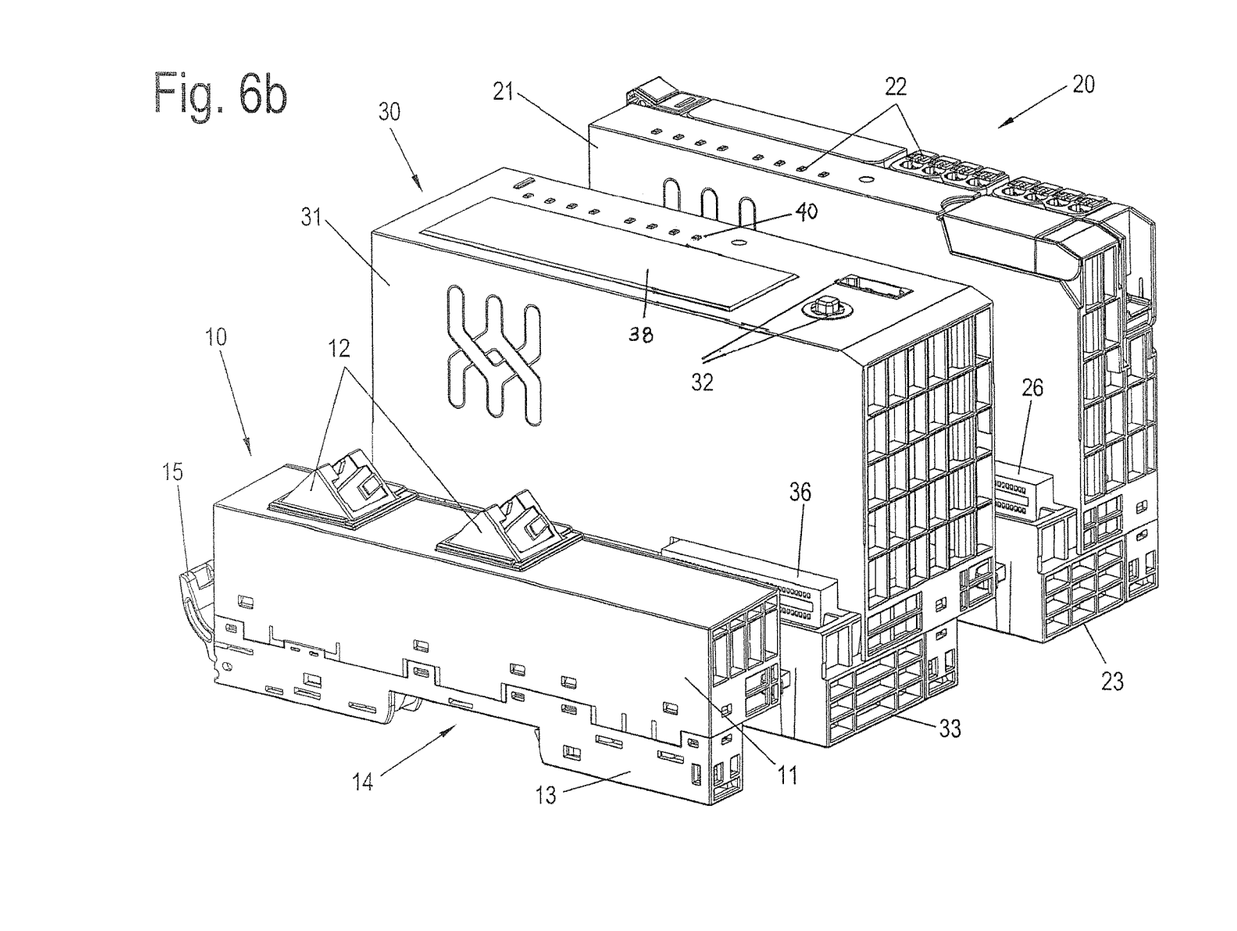
Figure 7:
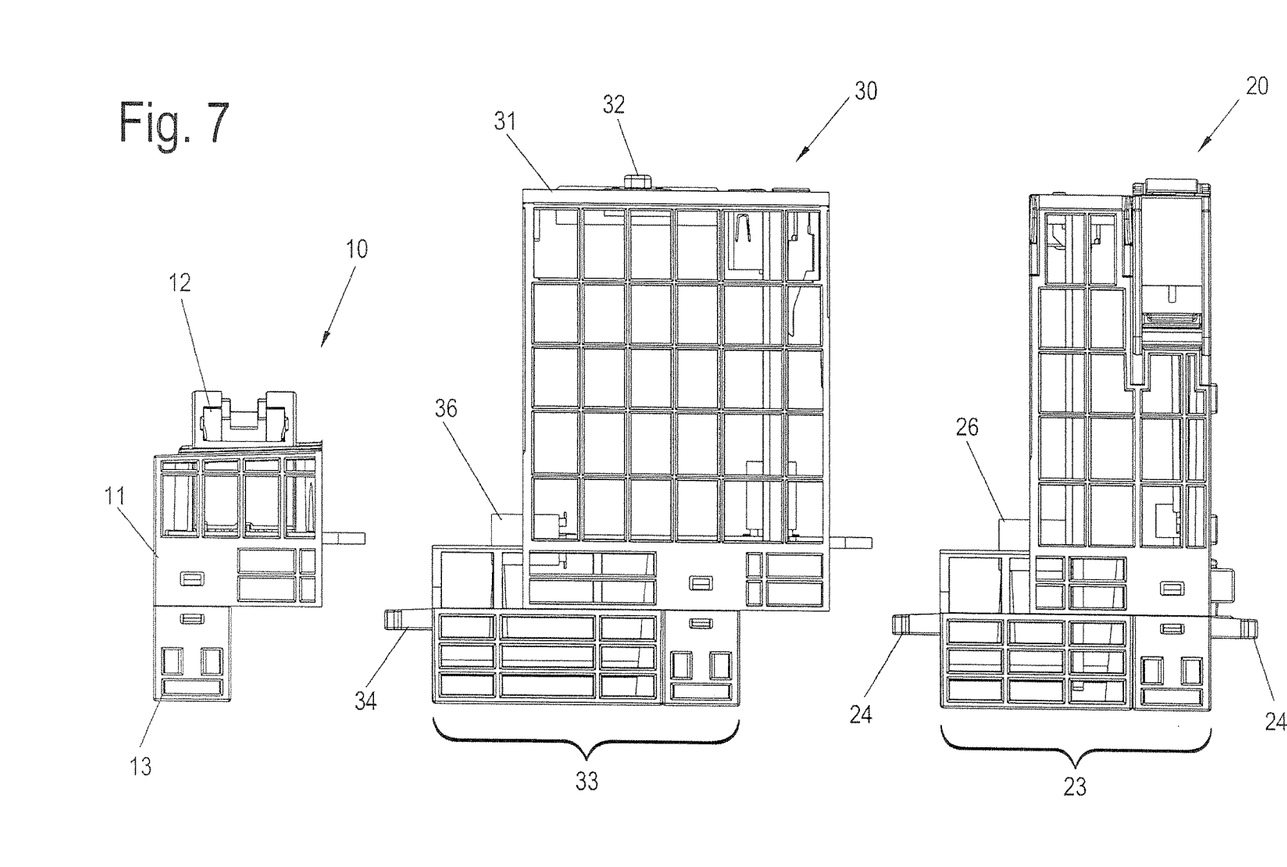
FIG. 7 is an exploded side view of the detached main modules and connection module of the automation device shown in FIG. 6b.
Figure 8:
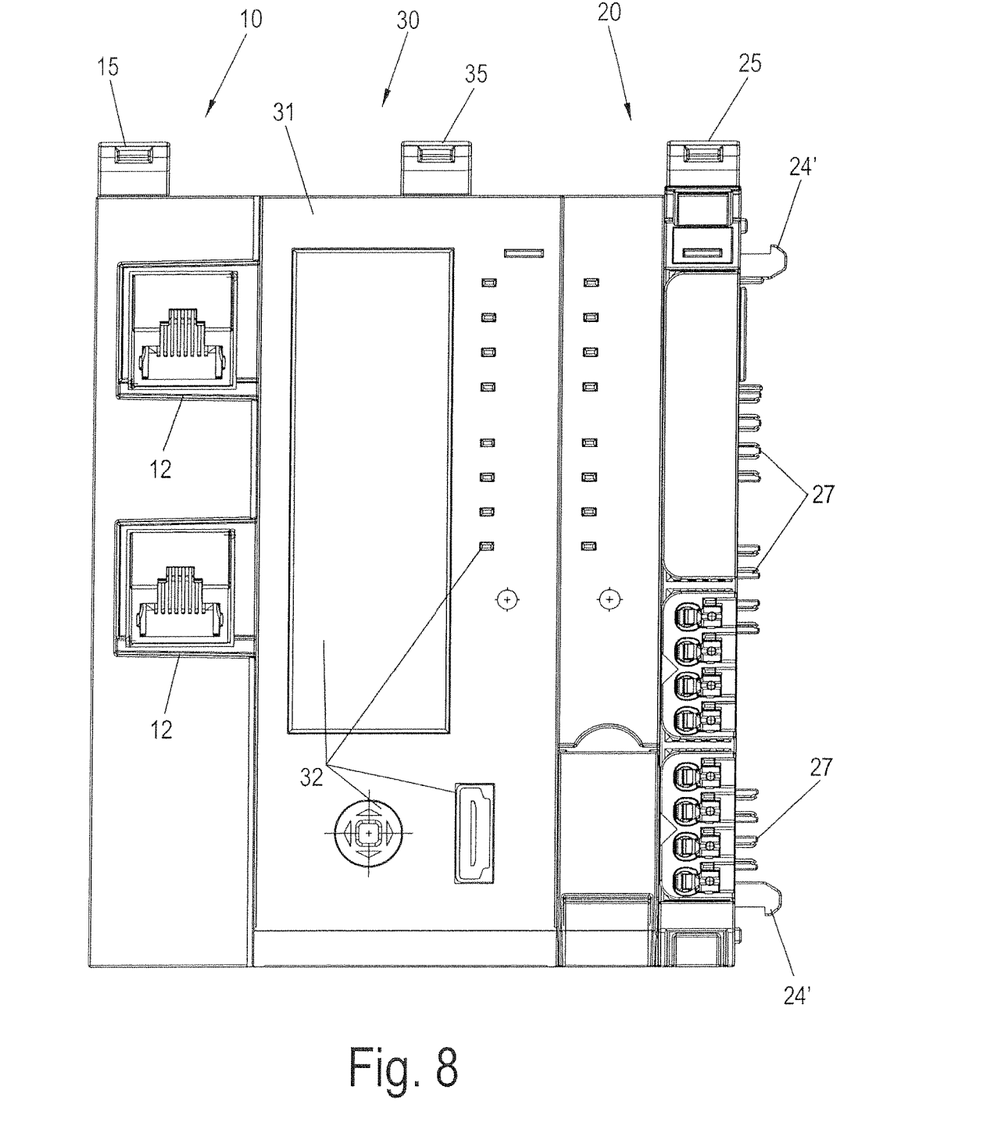

FIGS. 6 to 8 show a further embodiment of an automation device according to the present invention. In this embodiment, the automation device is a control computer, which is connected to a connection module 10 which provides fieldbus ports 12, as in the embodiments described above.

As with the automation device shown in FIGS. 1 to 5, the automation device embodied as a control computer has a main module 30, which is mechanically and electrically coupled to connection module 10.

The control computer communicates with field devices through which signals can be output or input. The field devices are connected via the fieldbus ports 12, either directly or indirectly via a fieldbus coupler such as the fieldbus coupler shown in FIGS. 1-5.

A main module 20 of a fieldbus coupler according to an embodiment of FIGS. 1 to 4 is also connected directly to the main module 30 of the control computer. This is possible because the control computer main module 30 is equipped on its side that is opposite the connection module 10 with a plug connector, not shown, which engages in the mating connector 26 of the fieldbus main module 20. As a result, information that is usually exchanged between the control computer and the fieldbus coupler via the fieldbus can be transferred directly between the main module 30 of the control computer and the main module 20 of the fieldbus coupler. This results in a compact automation system which includes both the control computer and a fieldbus coupler, to which corresponding bus-capable modules can be connected.

The system including the control computer main module 30 with the connection module 10 and with the main module 20 of the fieldbus coupler coupled thereto is shown in FIG. 6a in an assembled state and in FIG. 6b with the modules detached from one another. FIG. 7 is a side view of the detached modules, and FIG. 8 is a plan view of the modules in the assembled state.

In the embodiment shown in FIGS. 6 to 8, a multi-part housing is used for the main module 30, the housing including an upper section 31 and a lower section 33. Connection 32, display 38 and adjustment elements 40 are provided on the top surface of the housing upper section 31, similar to the main module 20 of the fieldbus coupler. For example, in addition to light-emitting diodes as status displays, a display field is shown, along with a USB port and a miniature joystick that can be finger-actuated for manipulating the system.

The side of the housing lower section 33 that faces the connection module 10 is similar in configuration to the housing lower section 23 of the fieldbus coupler main module 20. On the opposite side, the housing lower section 33 is similar in configuration to the corresponding side of the connection module 10, allowing it to be coupled to the fieldbus coupler main module 20. As is clear from the plan view in FIG. 8, an unlocking lever 35 is provided with which the control computer main module 30 can be locked onto a snap-on mounting rail. The snap-on mounting rail recess of the control computer main module 30 is not visible in FIG. 8.

Regarding the method of operation, reference is made to the description relating to FIG. 5. When operated as an automation device, information regarding the compatibility of the modules, licenses, and/or software updates of firmware in the control computer main module 30 can be input via the integrated non-volatile memory by the control computer main module 30.

While the preferred forms and embodiments of the invention have been illustrated and described, it will be apparent to those of ordinary skill in the art that various changes and modifications may be made without deviating from the inventive concepts set forth above.

What is claimed is:

1. A method for operating an automation device, comprising the steps of
   (a) connecting a main master control module including a microcontroller of the automation device with a connection module which provides a connection with a fieldbus;
   (b) using the microcontroller of the main master control module to read a non-volatile memory of the connection module, the non-volatile memory containing compatibility data for the main master control module and license data of the fieldbus to be connected with the connection module;
   (c) detecting data incompatibilities between the main master control module and the connection module and license data incompatibilities between the field bus and the main master control module; and
   (d) if no incompatibilities are detected, connecting the main master control module with the fieldbus via the connection module and placing the automation device in operation.

2. A method as defined in claim 1, wherein the incompatibilities relate to at least one of software, hardware and licenses.

3. A method as defined in claim 1, in which data from the non-volatile memory of the connection module are used in the main master control module to rectify any incompatibilities that are detected.

4. A method as defined in claim 3, wherein data from the non-volatile memory of the connection module are used to update operational software in the main master control module.

5. A method as defined in claim 1, wherein the connection module provides a wireless communication channel.

\* \* \* \* \*